United States Patent
Yoo

(10) Patent No.: US 7,915,632 B2
(45) Date of Patent: *Mar. 29, 2011

(54) DIODE HAVING VERTICAL STRUCTURE AND METHOD OF MANUFACTURING THE SAME

(75) Inventor: Myung Cheol Yoo, Pleasanton, CA (US)

(73) Assignee: LG Electronics Inc., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/840,840

(22) Filed: Jul. 21, 2010

(65) Prior Publication Data

US 2010/0314607 A1    Dec. 16, 2010

Related U.S. Application Data

(63) Continuation of application No. 12/654,894, filed on Jan. 7, 2010, now Pat. No. 7,863,638, which is a continuation of application No. 11/593,470, filed on Nov. 7, 2006, now Pat. No. 7,821,021, and a continuation of application No. 09/983,994, filed on Oct. 26, 2001, now Pat. No. 7,148,520.

(51) Int. Cl.
   *H01L 33/00*    (2010.01)
(52) U.S. Cl. ............... 257/98; 257/99; 257/E33.068
(58) Field of Classification Search ............... 257/98, 257/99, 100, E33.068
   See application file for complete search history.

(56) References Cited

U.S. PATENT DOCUMENTS

| | | | |
|---|---|---|---|
| 5,040,044 | A | 8/1991 | Noguchi et al. |
| 5,684,309 | A | 11/1997 | McIntosh et al. |
| 5,739,554 | A | 4/1998 | Edmond et al. |
| 5,798,537 | A | 8/1998 | Nitta |
| 5,929,466 | A | 7/1999 | Ohba et al. |
| 6,078,064 | A | 6/2000 | Ming-Jiunn et al. |
| 6,100,545 | A | 8/2000 | Chiyo et al. |
| 6,107,647 | A | 8/2000 | Matsumoto |
| 6,120,600 | A | 9/2000 | Edmond et al. |
| 6,172,382 | B1 | 1/2001 | Nagahama et al. |
| 6,329,216 | B1 | 12/2001 | Matsumoto et al. |
| 6,335,217 | B1 | 1/2002 | Chiyo et al. |
| 6,358,770 | B2 | 3/2002 | Itoh et al. |
| 6,426,512 | B1 | 7/2002 | Ito et al. |
| 6,479,839 | B2 | 11/2002 | Nikolaev et al. |
| 6,495,894 | B2 | 12/2002 | Shibata et al. |

(Continued)

FOREIGN PATENT DOCUMENTS

DE    200 09 283    12/2000

(Continued)

OTHER PUBLICATIONS

Park et al., "Growth of GaN Layer from the Single-Source Precursor $(Et_2GaNH_2)_3$,", Chem. Matter, vol. 10, pp. 2251-2257, 1998.

(Continued)

*Primary Examiner* — Minh-Loan T Tran
(74) *Attorney, Agent, or Firm* — McKenna Long & Aldridge LLP

(57) ABSTRACT

A light emitting diode includes a conductive layer, an n-GaN layer on the conductive layer, an active layer on the n-GaN layer, a p-GaN layer on the active layer, and a p-electrode on the p-GaN layer. The conductive layer is an n-electrode.

42 Claims, 8 Drawing Sheets

U.S. PATENT DOCUMENTS

| | | |
|---|---|---|
| 6,500,689 B2 | 12/2002 | Uemura et al. |
| 6,508,878 B2 | 1/2003 | Kim et al. |
| 6,555,405 B2 | 4/2003 | Chen et al. |
| 6,614,060 B1 | 9/2003 | Wang et al. |
| 6,639,925 B2 | 10/2003 | Niwa et al. |
| 6,693,935 B2 | 2/2004 | Tojo et al. |
| 6,791,119 B2 | 9/2004 | Slater et al. |
| 6,803,603 B1 | 10/2004 | Nitta et al. |
| 6,878,563 B2 | 4/2005 | Bader et al. |
| 6,992,334 B1 | 1/2006 | Wierer et al. |
| 7,109,529 B2 | 9/2006 | Uemura et al. |
| 7,148,520 B2 * | 12/2006 | Yoo ................ 257/98 |
| 2001/0026950 A1 | 10/2001 | Sunakawa et al. |
| 2001/0042866 A1 | 11/2001 | Coman et al. |
| 2002/0137244 A1 | 9/2002 | Chen et al. |
| 2003/0205717 A1 | 11/2003 | Khare et al. |
| 2004/0051105 A1 | 3/2004 | Tsuda et al. |
| 2007/0012944 A1 | 1/2007 | Bader et al. |
| 2007/0057273 A1 * | 3/2007 | Yoo ................ 257/99 |
| 2010/0109020 A1 * | 5/2010 | Yoo ................ 257/76 |

FOREIGN PATENT DOCUMENTS

| | | |
|---|---|---|
| GB | 2 352 326 | 1/2001 |
| JP | 2000-323797 | 11/2000 |
| JP | 2001077476 | 3/2001 |
| JP | 2001210868 | 8/2001 |
| JP | 2001-339100 | 12/2001 |
| WO | WO 01/47038 A1 | 6/2001 |

OTHER PUBLICATIONS

Notification of Transmittal of International Preliminary Examination Report.

Continuous-Wave Operation of InGaN Multiple-Quantum-Well Laser Diodes on Copper Substrates Obtained by Laser Liftoff, IEEE Journal on Selected Topics in Quantum Electronics, vol. 7, No. 2, Mar./Apr. 2001.

Continuous-Wave InGaN Multiple-Quantum-Well Laser Diodes on Copper Substrates, Applied Physics Letters vol. 78, No. 9, Feb. 26, 2001.

The integration of $In_xGa_{1-x}N$ Multiple-Quantum-Well Laser Diodes with Copper Substrates by Laser Lift-Off, Jpn. J. Appl. Phys. vol. 39 (2000) pp. L 1203-L 1205, Part 2. No. 12A, Dec. 1, 2000.

Michael Kneissl, et al., "Continuous-Wave Operation of InGAN Multiple-Quantum-Well Laser Diodes on Copper Substrates Obtained by Laser Liftoff," IEEE Journal on Selected Topics in Quantum Electronics, vol. 7, No. 2, Mar./Apr. 2001, pp. 188-191.

William S. Wong, et al., "Continuous-wave InGaN Multiple-Quantum-Well Laser Diodes on Copper Substrates," Applied Physics Letters, vol. 78, No. 9, Feb. 2001, pp. 1198-1200.

William S. Wong, et al, "The Integration of $In_xGa_{1-x}N$ Multiple-Quantum-Well Laser Diodes with Copper Substrates by Laser Lift-Off," Jpn. J. Appl. Phys. vol. 39, Dec. 2000, pp. 1203-1205.

Crawford M H et al: "Design and performance of nitride-based UV LEDs" Wide-Band Gap Eletrionic Device. Symposium, Apr. 2000.

* cited by examiner

Fig. 5

| | |
|---|---|
| p-GaN | 180 |
| Active Layer (AlInGaN) | 160 |
| n-GaN (Epitaxially Grown) | 140 |
| Buffer (VPE Grown n-GaN) | 120 |
| Buffer (VPE Grown GaN) | 110 |
| Sapphire Substrate | 100 |

Fig. 6A

| | |
|---|---|
| p-GaN | 180 |
| Active Layer (AlInGaN) | 160 |
| n-GaN (Epitaxially Grown) | 140 |
| Buffer (VPE Grown n-GaN) | 120 |
| Buffer (VPE Grown GaN) | 110 |
| Sapphire Substrate | 100 |

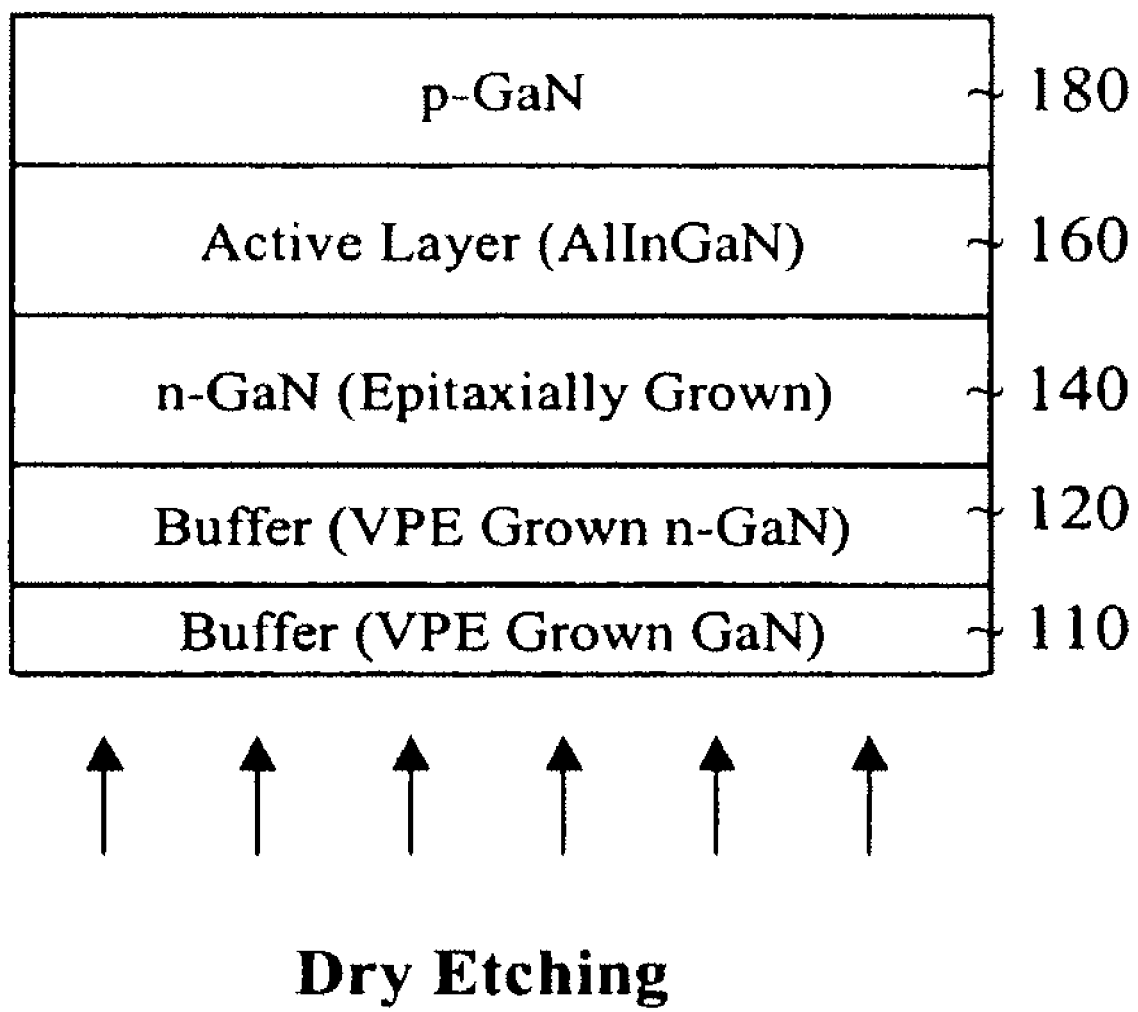

DIODE HAVING VERTICAL STRUCTURE AND METHOD OF MANUFACTURING THE SAME

This application is a Continuation of application Ser. Nos. 12/654,894 filed Jan. 7, 2010 now U.S. Pat. No. 7,863,638; 11/593,470 filed on Nov. 7, 2006 now U.S. Pat. No. 7,821,021 and 09/983,994 filed Oct. 26, 2001 (U.S. Pat. No. 7,148,520), all of which are hereby incorporated by reference.

BACKGROUND OF THE INVENTION

1. Field of the Invention

The present invention relates to diodes, and more particularly, to a vertical structure light emitting diode (LED). Although the present invention is discussed with reference to a GaN-based light emitting diode, the present invention can be used for various types of light emitting diodes, and can be further used in a wide range of applications including, for example, other types of diodes such as laser diodes.

2. Discussion of the Related Art

Light emitting diodes, commonly referred to as "LEDs," are semiconductor devices which convert electrical power into emitted light. It is well known in the art that when electrons transition between their allowed energy levels in atoms or molecules, these transitions are always accompanied by a gain or loss of specific quanta of energy. In a light emitting diode, the generation or injection of a current of either electrons or holes across the diode junction encourages such electronic transitions, which in turn result in either vibrational energy or light, or both. As is further known in the art, the color of light that can be produced by a light emitting diode is generally limited by the characteristics of the semiconductor material, most significantly by the band-gap which represents the energy level differences between the valence band and conduction band of individual atoms.

Gallium-Nitride (GaN) has recently gained much attention from researchers in the field of LEDs, since its material characteristics of a wide and direct band gap are suitable for making a blue LED, which has been considered the most difficult one to fabricate among other red and green LEDs.

Accordingly, GaN-based opto-electronic device technology has rapidly evolved from the realm of device research and development to commercial reality, since these devices have been introduced in the market in 1994. The efficiency of GaN light emitting diodes, for example, has surpassed that of incandescent lighting, and is now comparable with that of fluorescent lighting.

The market growth for GaN-based devices has been far exceeding than the industrial market prediction every year. Despite of such rapid speed of the development, it is still too expensive to realize a full color display with GaN-based devices. This is because the manufacturing cost of blue LEDs, which are essential to realizing a full color display, is high compared with the other visible LEDs. The wafer size for making blue LEDs is limited to 2 inches, and the process of growing a GaN epitaxial layer is more difficult than other semiconductor materials. Therefore, it is crucial that developments of mass production technology, without sacrificing performance, are the main issue in reducing the manufacturing costs of blue LEDs, thereby to utilize full color displays using GaN LEDs at an inexpensive price, the efficiency of which is far better than currently available.

In general, GaN-based LEDs are fabricated with a lateral structure using a sapphire substrate, since sapphire is the material that makes the GaN epitaxial layer grow with fewer defects than other materials as a substrate. Since sapphire is an electrical insulator, the lateral type LEDs having both n and p metal contacts on the topside is inevitable to inject current flows in the MQW layer.

FIG. 1 schematically illustrates conventional lateral type LED device. Referring to FIG. 1, the convention lateral type LED includes a substrate 100, such as sapphire. A buffer layer 120, which is optional and is made of, for example, gallium nitride (GaN), is formed on the substrate 100. An n-type GaN layer 140 is formed on the buffer layer 120. An active layer such as a multiple quantum well (MQW) layer 160 of aluminum-indium-gallium-nitride (AlInGaN), for example, is formed on the n-type GaN layer 140. A p-type GaN layer 180 is formed on the active layer 160. A transparent conductive layer 220 is formed on the p-GaN layer 180. The transparent conductive layer 220 may be made of any suitable material including, for example, Ni/Au or indium-tin-oxide (ITO). A p-type electrode 240 is then formed on one side of the transparent conductive layer 220. The p-type electrode 240 may be made of any suitable material including, for example, Ni/Au, Pd/Au, Pd/Ni and Pt. A pad 260 is formed on the p-type electrode 240. The pad may be made of any suitable material including, for example, Au. The transparent conductive layer 220, the p-GaN layer 180, the active layer 160 and the n-GaN layer 140 are all etched at one portion to form an n-electrode 250 and pad 270.

Since sapphire is an insulator, the n-GaN layer should be exposed to form an n-metal contact. A dry-etching method is generally used, since GaN is not etched by a chemical etching method. This is a significant disadvantage since additional lithography and stripping processes are required. In addition, plasma damages on the GaN surface are often sustained during a dry-etch process. Moreover, the lateral device structure requires a large device dimension since two metal contacts need to be formed on top of the device. Furthermore, the lateral structure device is vulnerable to static electricity because two metal electrodes are positioned close each other. Thus, the lateral structure GaN based LEDs may not be suitable for high voltage applications, such as traffic indicators and signal lights.

Currently, a vertical structure of GaN-based LEDs is fabricated by Cree Research Inc. using a silicon carbide (SiC) substrate. Due to the high manufacturing cost, however, the LEDs with SiC substrate are not suitable for mass production. In addition, SiC is known in the art to be very sensitive to hydrogen atoms, which exist during the epitaxial growth of GaN layer by metal organic chemical vapor deposition (MOCVD) method, which is the most common way of growing GaN epitaxial layers considering the epitaxial film quality. An additional process called "surface treatment" is necessary in order to grow high quality GaN-based epitaxial films. Furthermore, the GaN based LEDs with a SiC substrate requires an additional conductive buffer layer on the SiC substrate before growing the GaN epitaxial layer, which is not necessary for lateral structure devices.

SUMMARY OF THE INVENTION

Accordingly, the present invention is directed to a method of fabricating simple vertical structure LEDs for mass production that substantially obviates one or more of the problems due to limitations and disadvantages of the related art.

An advantage of the present invention is to increase the number of LED devices fabricated within a limited wafer area.

Another advantage of the present invention is LED devices having a simplified fabrication process steps.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method of making light emitting diodes comprises forming a buffer GaN layer by vapor phase epitaxy (VPE) on a sapphire substrate; forming an n-GaN epitaxial layer by MOCVD on the buffer GaN; forming a multi-quantum-well (MQW) layer on the n-GaN epitaxial layer; forming a p-GaN layer on the MQW layer by MOCVD; a step of separating the sapphire substrate from other layers; forming p and n metal contacts; forming a metal transparent contact on the side of the p-GaN layer; and forming a metal pad on the p-GaN layer.

In another aspect, a method of making light emitting diodes comprises forming a buffer GaN layer by VPE on a sapphire substrate; forming an undoped GaN layer by VPE on the buffer GaN layer; forming an n-GaN layer by VPE on the undoped GaN layer; forming a n-GaN epitaxial layer by MOCVD on the n-GaN grown by VPE; forming a MQW layer on the n-GaN epitaxial layer; forming a p-GaN layer on the MQW layer by MOCVD; a step of separating the sapphire substrate from other layers; forming p and n metal contacts; forming a metal transparent contact on the p-GaN layer; and forming a metal pad on the p-GaN layer.

In another aspect, a method of making light emitting diodes comprises forming a buffer GaN layer by VPE on a sapphire substrate; forming an n-GaN epitaxial layer by MOCVD on the buffer GaN layer; forming a MQW layer on the n-GaN epitaxial layer; forming a p-AlGaN cladding layer on the MQW layer by MOCVD; forming a p-GaN conducting layer on the p-AlGaN layer by MOCVD; a step of separating the sapphire substrate from other layers; forming p and n metal contacts; forming a metal transparent contact on the p-GaN layer; and forming a metal pad on the p-GaN layer.

In a further aspect, a method of making light emitting diodes comprises forming a buffer GaN layer by VPE on a sapphire substrate; forming an undoped GaN layer by VPE on the buffer GaN layer; forming an n-GaN layer by VPE on the undoped GaN layer; forming a n-GaN epitaxial layer by MOCVD on the n-GaN grown by VPE; forming a MQW layer on the n-GaN epitaxial layer; forming a p-AlGaN cladding layer on the MQW layer by MOCVD; forming a p-GaN conducting layer on the p-AlGaN layer by MOCVD; a step of separating the sapphire substrate from other layers; forming p and n metal contacts; forming a metal transparent contact on the p-GaN layer; and forming a metal pad on the p-GaN layer.

It is to be understood that both the foregoing general description and the following detailed description are exemplary and explanatory and are intended to provide further explanation of the invention as claimed.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings:

FIGS. 3-8B show the manufacturing steps for forming the light emitting diode according to the present invention.

DETAILED DESCRIPTION OF THE INVENTION

Reference will now be made in detail to the present invention, examples of which are illustrated in the accompanying drawings.

Figure 1:
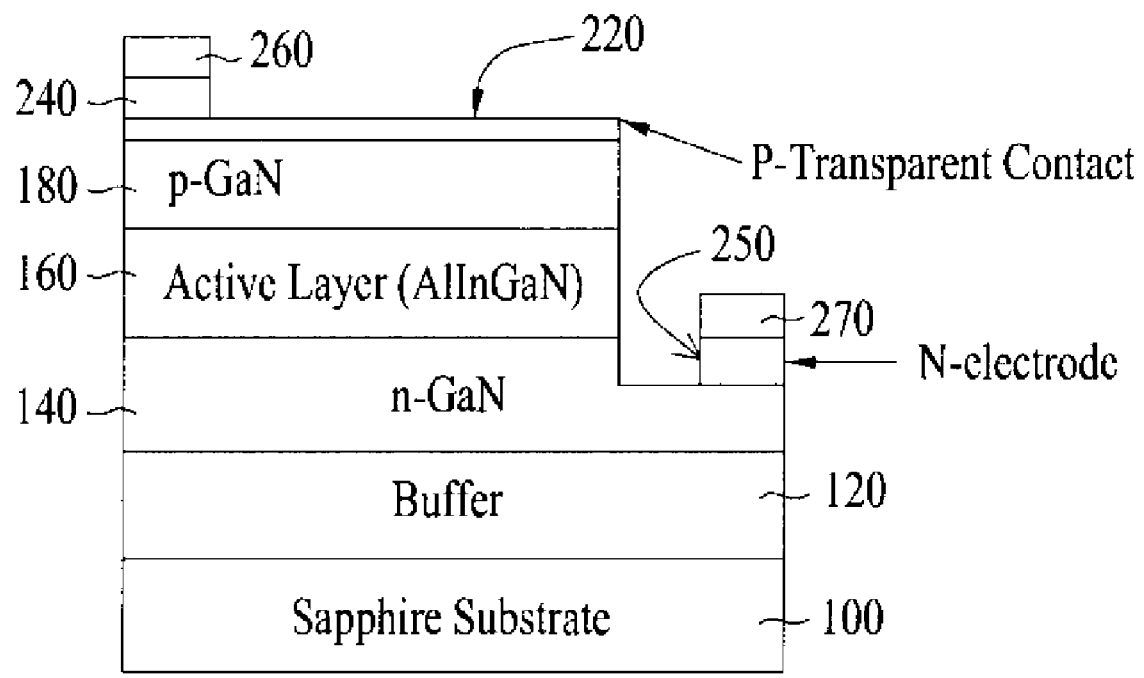
FIG. 1 shows a conventional lateral structure LED.
Figure 2:
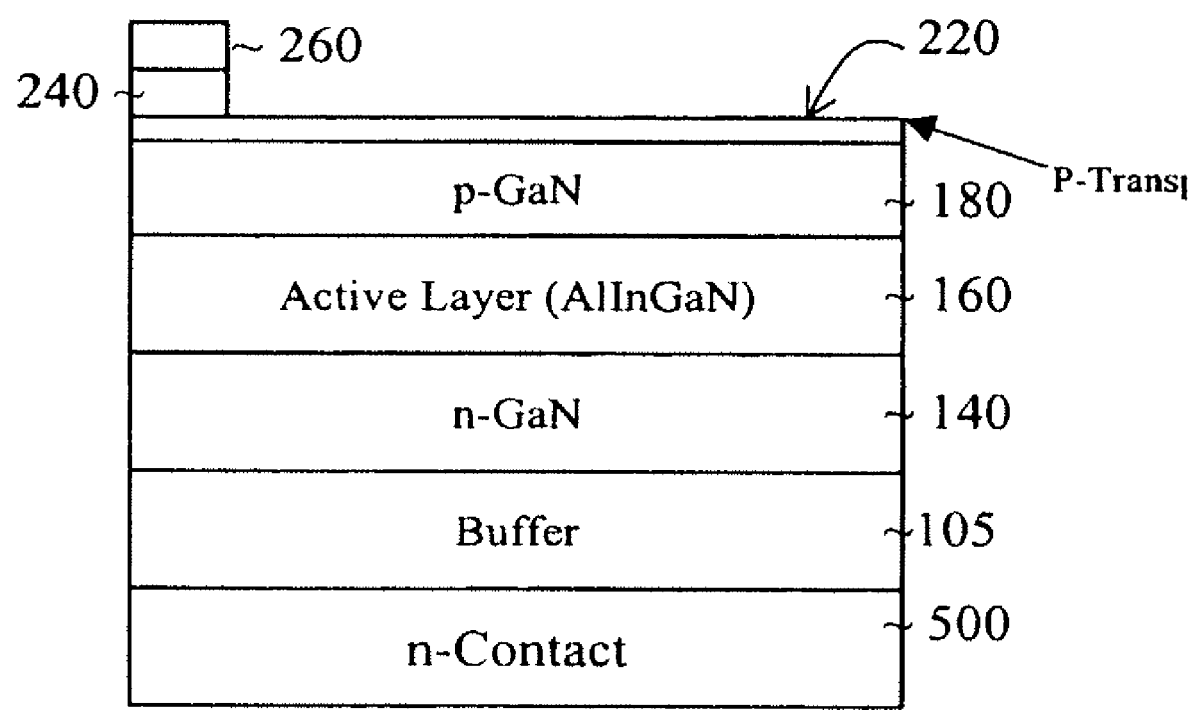
FIG. 2 shows a vertical structure LED according one embodiment of the present invention.

FIG. 2 shows a vertical structure light emitting diode in accordance with one embodiment of the present invention. Referring to FIG. 2, the vertical LED includes an n-contact 500. A buffer layer made of GaN 105 is on the n-contact 500. An n-GaN layer 140 is on the buffer layer 105. An active layer 160 made of, for example, a multiple quantum well (MQW) layer including AlInGaN is on the n-GaN layer 140. A p-GaN layer 180 is on the active layer 160. A p-contact layer 220 is on the p-GaN layer 180. A p-electrode 240 and a pad 260 are formed on the p-contact layer 220.

In the LED shown in FIG. 2, the n-contact 500 may serve two functions. First, the n-contact 500 serves an electrical function as a conductive material. Second, the re-contact 500 can also serve to reflect photons emitted from the active layer 160 to the n-contact 500. This increases the brightness of the LED since photons that would otherwise be absorbed or wasted in some other manner would reflect off of the n-contact 500 and emit light. A material having good reflective characteristics such as that of a mirror can be used as the n-contact 500. One such example is a polished aluminum layer. Such reflective characteristics are described in more detail in a co-pending application entitled "DIODE HAVING HIGH BRIGHTNESS AND METHOD THEREOF" by Myung Cheol Yoo, filed on Jul. 17, 2001 by the same assignee as the present application, the entirety of which contents is hereby incorporated by reference in this application. The material for the re-contact 500 is discussed in detail below.

A benefit of this vertical structure LED of the present invention is the significant reduction in the size of the LED chip as compared to the lateral structure of the conventional LED. Due to its small chip size, significantly more chips can be formed on the same size wafer, such as sapphire. Moreover, the number of process steps for forming the vertical structure LED of the present invention is reduced, as discussed in more detail below. FIGS. 3-8 schematically illustrate a process for manufacturing vertical structure GaN-based light emitting diodes (LEDs) according to the present invention. In order to fabricate GaN-based LEDs, sapphire substrate has been generally used since sapphire is very stable and relatively inexpensive. The epitaxial layer quality of the various GaN layers grown on sapphire substrate is superior to other substrate materials due to their thermal stability and the similar crystal structure of the GaN.

Figure 3:
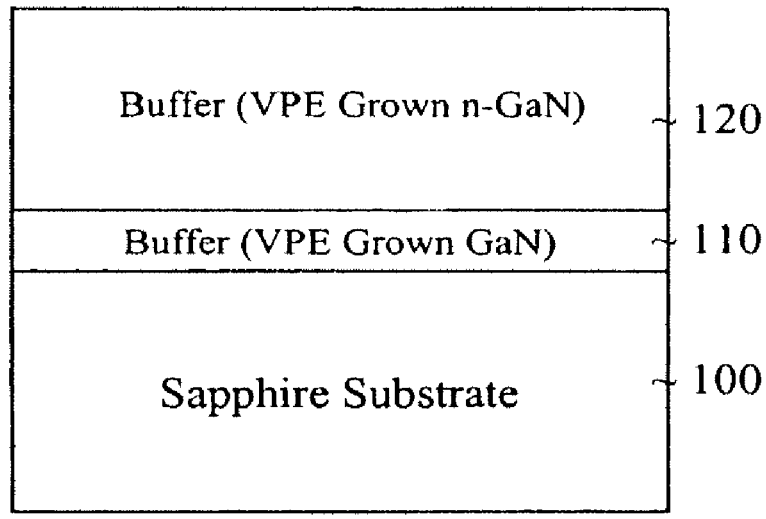

Referring to FIG. 3, a buffer layer 120, is formed on a transparent substrate 100, beneficially a sapphire substrate. The buffer layer 120, which eventually replaces the function of the sapphire substrate 100, may be formed as one, two or three layers. For example, the buffer layer 120 may have only the n-GaN layer that is grown by VPE. For a two layer buffer layer, a first layer of GaN layer 110 is grown on the sapphire substrate such as by VPE and a second layer of an n-GaN layer 120 is grown on the GaN layer 110 such as by VPE. For a three layer buffer layer, a first layer of GaN layer 110 is grown on the sapphire substrate such as by VPE, a second layer of an undoped GaN layer 130 is grown on the first layer of GaN layer 110 such as by VPE, and a third layer of an n-GaN layer 120 is grown on the undoped GaN layer 130 such as by VPE.

The GaN layer 110 may be formed to have a thickness in a range of about 40-50 nm. The undoped GaN layer 130 may be formed to have a thickness in a range of about 30-40 μm. The n-GaN layer 120 may be formed to have a thickness of about 1-2 μm. For n-GaN 120, silene gas ($SiH_4$) may be used as the n-type dopant.

Figure 4:
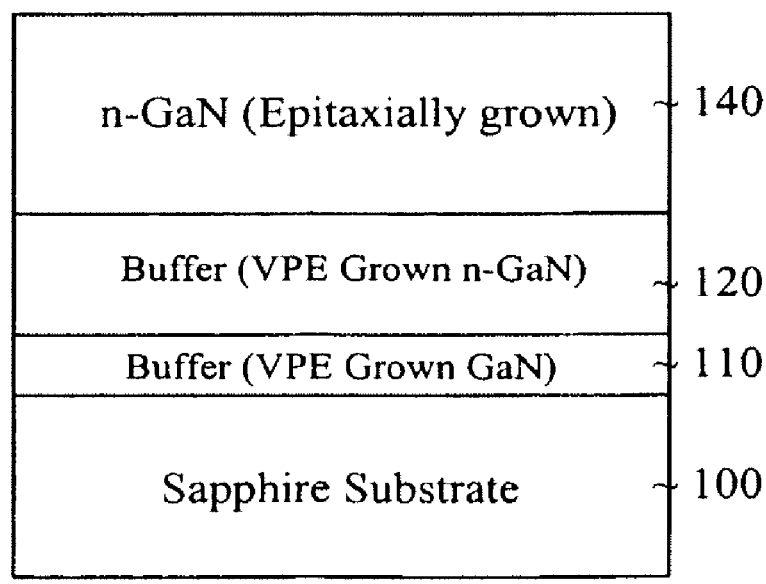
Figure 7:
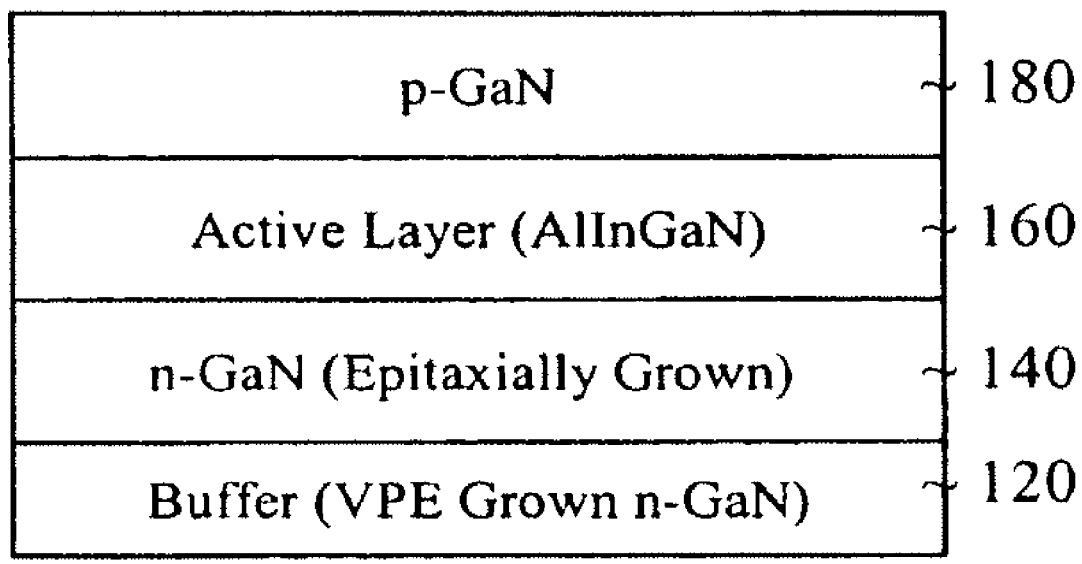

Referring to FIG. 4, an n-type epitaxial layer such as n-GaN 140 is epitaxially grown on the buffer layer 120 by a metal organic chemical vapor deposition (MOCVD) method. Beneficially, a chemical cleaning step (not shown in the figure) of the buffer layer 120 grown by VPE method can be added prior to growing the n-GaN layer 140 by MOCVD method in order to obtain a good quality of the n-GaN epitaxial layer 140. In this instance, the n-GaN layer 140 was doped with silicon (Si) with a doping concentration of about $10^{17}$ $cm^{-3}$ or greater.

Referring to FIG. 5, an active layer 160 such as an AlInGaN multiple quantum well (MQW) layer is formed by MOCVD method on the n-GaN layer 140. The active layer 160 may be of any suitable structure including a single quantum well layer or a double hetero structure. In this instance, the amount of indium (In) determines whether the diode takes on a green color or a blue color. For an LED with blue light, about 22% of indium may be used. For an LED with green light, about 40% of indium may be used. The amount of iridium used may be varied depending on the desired wavelength of the blue or green color. Subsequently, a p-GaN layer 180 is formed by MOCVD method using, for example, $CP_2Mg$ as a p-type dopant on the active layer 160. In this instance, the p-GaN layer 180 was doped with magnesium (Mg) with a doping concentration of about $10^{17}$ $cm^{-3}$ or greater.

Referring to FIG. 6A, the sapphire substrate 100 is separated from other layers preferably by a laser lift-off method. Other suitable techniques may be used to separate the sapphire substrate 100 from the other layers. The other layers include the buffer layer 120, n-GaN layer 140, active layer 160, and the p-GaN layer 180. By removing the sapphire substrate 100, which is an electrical insulator, from the device, an n-metal contact can be formed under the n-type GaN buffer layer 120, which is an electrical conductor.

Referring to FIG. 6B, after the substrate 100 is removed, the layers below the buffer layer 120 may be removed as well using, for example, dry etching. This step will expose the n-GaN buffer layer 120 that will be electrically attached to the n-contact 500, as shown in FIG. 8A.

Figure 8A:
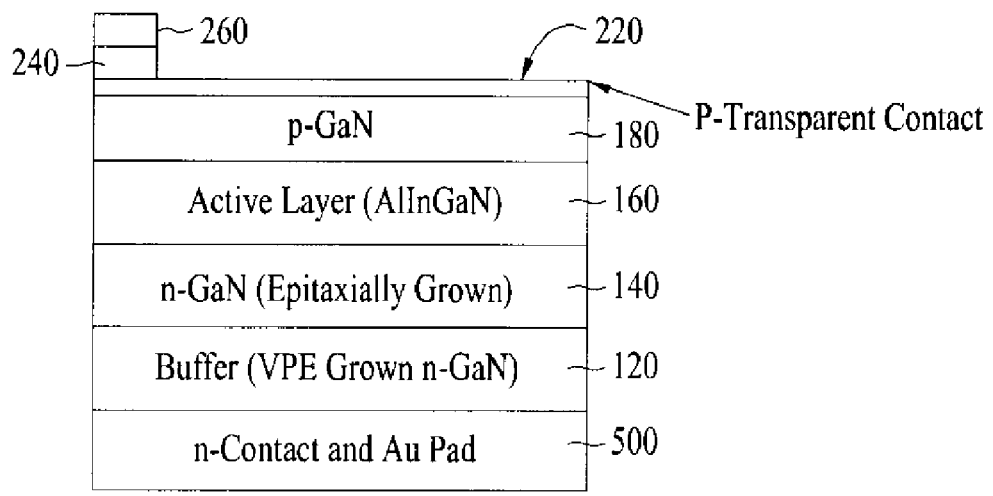
Figure 8B:
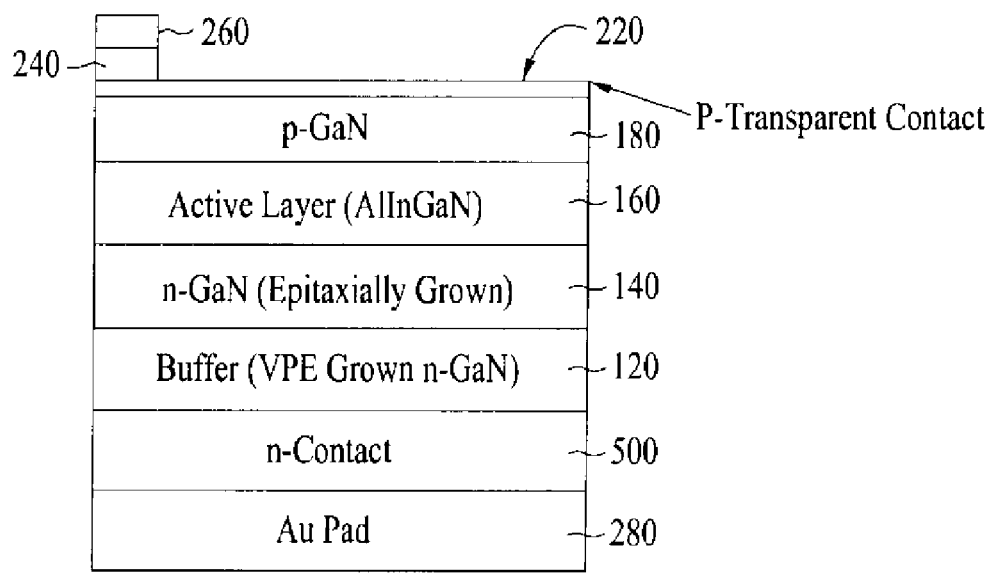

Referring to FIG. 8A, a transparent conductive layer 220 is formed on the p-GaN layer 180. The transparent conductive layer 220 may be made of any suitable material including, for example, indium-tin-oxide (ITO). A p-type electrode 240 is formed on the transparent conductive layer 220. An n-type electrode 500 is formed on the bottom of the buffer layer 120. The p-type electrode 240 may be made of any suitable material including, for example, Ni/Au, Pd/Au, Pd/Ni and Pt. The n-type electrode 500 may be made of any suitable material including, for example, Ti/Al, Cr/Au and Ti/Au. A pad 260 is formed on the p-type electrode 240. The pad 260 may be made of any suitable material including, for example, Au. The pad 260 may have a thickness of about 0.5 μm or higher. Unlike the p-type electrode 240, the n-type electrode 500 does not require a pad, although one can be used, if desired. Referring to FIG. 8B, an Au pad 280 is formed on the n-type electrode 500.

Figure 9:
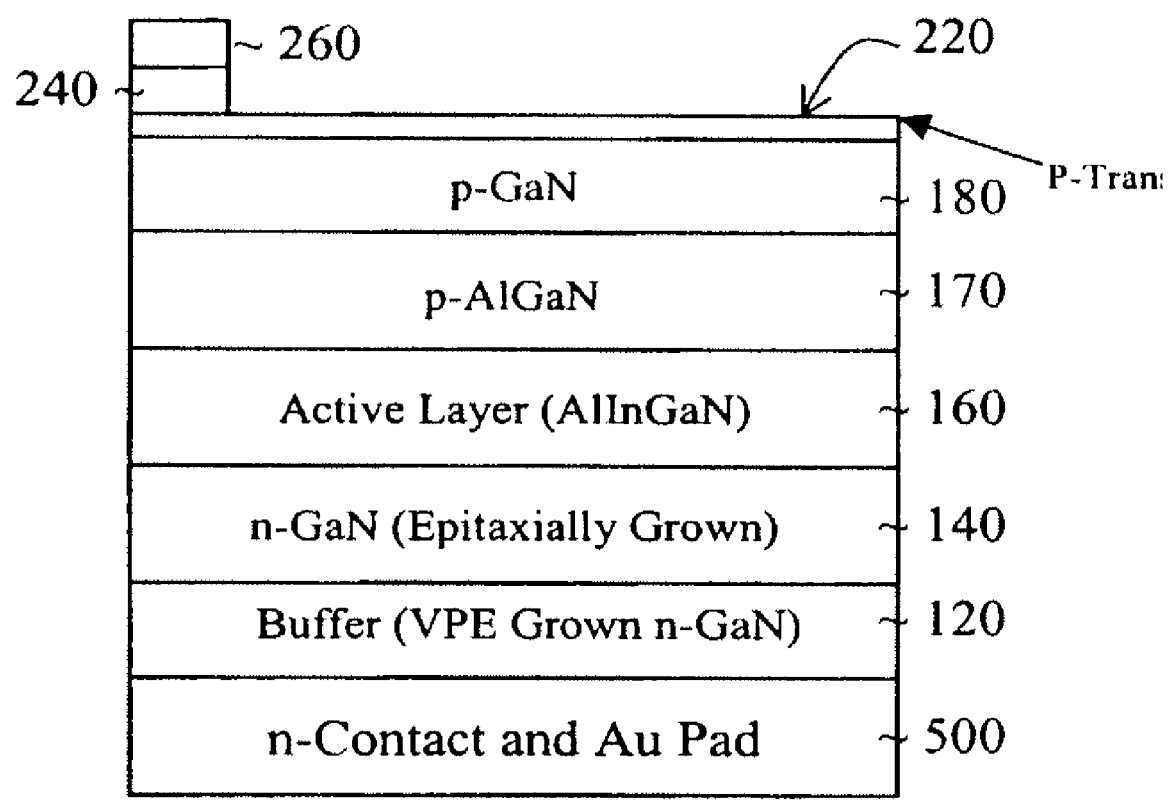
FIG. 9 shows another embodiment of the vertical structure LED of the present invention.

FIG. 9 shows an alternative embodiment in which a cladding layer 170 is formed between the p-GaN layer 180 and the active layer 160. The cladding layer 170 is preferably formed with p-AlGaN by MOCVD method using $CP_2Mg$ as a p-type dopant. The cladding layer 170 enhances the performance of the LED device.

According to the present invention, there are many advantages compared with both conventional lateral and vertical GaN-based LEDs. Compared with the conventional lateral structure GaN-based LEDs, the manufacturing process according to the present invention increases the number of LED devices fabricated on a given wafer size, since there is no n-metal contact on top of the devices. The device dimension can be reduced, for example, from 250×250 μm to about 160×160 μm or smaller. By not having the n-metal contact above the substrate or on top of the device, according to the present invention, the manufacturing process is significantly simplified. This is because additional photolithography and etch processes are not required to form the n-metal contact and there is no plasma damage which are often sustained on the n-GaN layer in the conventional lateral structure GaN-based LEDs. Furthermore, the LED devices fabricated according to the present invention are much more immune to static electricity, which makes the LED more suitable for high voltage applications than conventional lateral structure LED devices.

In general, the deposition method of VPE is much simpler and requires less time to grow epitaxial layers with certain thickness than the deposition method of MOCVD. Therefore, the fabrication process is more simplified and the process time is more reduced even compared with those of the conventional vertical GaN-based LEDs in that the manufacturing process according to the present invention does not require growing buffer and n-GaN layers by MOCVD method. In total, the number of manufacturing steps is reduced, for example, from 28 steps with the conventional method to 15 steps with the method of the present invention. In addition, the manufacturing cost is reduced considerably compared with the conventional vertical structure GaN-based LEDs, which use silicon carbide (SiC) as a substrate, which can be 10 times more expensive than that of a sapphire substrate. Moreover, the method according to the present invention provides better metal adhesion between bonding pads and both n and p contacts than the conventional vertical structure GaN-based LEDs.

With the present invention, mass production of GaN-based LEDs at an inexpensive cost is made possible without sacrificing or changing the desired characteristics of the LEDs. Moreover, the vertical structure of the LED of the present invention, with an added feature of a reflective bottom n-contact, enhances the brightness of the LED. This invention can be applied not only to the current commercially available blue, green, red and white LEDs but also to other suitable devices.

Although the present invention has been described in detail with reference to GaN technology diodes, the present invention can easily be applied to other types of diodes including red LEDs and laser diodes including Vertical Cavity Surface Emitting Lasers (VCSELs).

It will be apparent to those skilled in the art that various modifications and variation can be made in the present invention without departing from the split or scope of the invention. Thus, it is intended that the present invention cover the modifications and variations of this invention provided they come within the scope of the appended claims and their equivalents.

What is claimed is:
1. A light emitting device comprising:
a metal layer;

a reflective conductive layer on the metal layer, the reflective conductive layer serving as a first electrode;
a first-type GaN-based layer having a first surface on the reflective conductive layer;
an active layer on the first-type GaN-based layer; and
a second-type GaN-based layer on the active layer;
a second electrode on a second surface of the second-type GaN-based layer, wherein the second surface is opposite the first surface with respect to the active layer,
wherein the reflective conductive layer and the second surface are configured such that the reflective conductive layer reflects light from the active layer back through the second surface.

2. The light emitting device according to claim 1, wherein the reflective conductive layer comprises at least one of Al, Ti/Al, Cr/Au and Ti/Au.

3. The light emitting device according to claim 1, wherein the reflective conductive layer comprises at least one of Al, Ti, Cr and Au.

4. The light emitting device according to claim 1, wherein the second electrode comprises at least one of Ni/Au, Pd/Au, Pd/Ni and Pt.

5. The light emitting device according to claim 1, wherein the second electrode comprises at least one of Ni, Au, Pd and Pt.

6. The light emitting device according to claim 1, wherein the active layer comprises AlInGaN.

7. The light emitting device according to claim 1, wherein the active layer comprises at least one of a quantum well layer and a double hetero structure.

8. The light emitting device according to claim 1, further comprising a cladding layer on the active layer.

9. The light emitting device according to claim 8, wherein the cladding layer is arranged between the second-type GaN-based layer and the active layer.

10. The light emitting device according to claim 8, wherein the cladding layer comprises AlGaN.

11. The light emitting device according to claim 1, wherein the metal layer is located at the bottom of the device.

12. The light emitting device according to claim 1, wherein the metal layer contacts the reflective conductive layer.

13. The light emitting device according to claim 1, wherein the metal layer is configured to serve as a first pad.

14. The light emitting device according to claim 1, wherein the metal layer comprises Au.

15. The light emitting device according to claim 1, further comprising a transparent layer on the second-type GaN-based layer.

16. The light emitting device according to claim 15, wherein the transparent layer comprises a transparent contact.

17. The light emitting device according to claim 16, the transparent contact comprises a transparent conductive oxide.

18. The light emitting device according to claim 16, wherein the transparent contact comprises indium-tin-oxide.

19. The light emitting device according to claim 1, further comprising a buffer layer between the first-type GaN-based layer and the reflective conductive layer.

20. The light emitting device according to claim 19, wherein a thickness of the buffer layer is about 1-2 μm.

21. The light emitting device according to claim 1, further comprising a second pad on the second electrode.

22. The light emitting device according to claim 21, wherein the second pad comprises Au.

23. The light emitting device according to claim 21, wherein a width of the second pad is substantially the same as a width of the second electrode.

24. The light emitting device according to claim 21, wherein the second pad overlaps the second electrode.

25. The light emitting device according to claim 21, wherein a thickness of the second pad is about 0.5 μm or higher.

26. The light emitting device according to claim 1, wherein the active layer has about 22% of indium composition.

27. The light emitting device according to claim 1, wherein the active layer has about 40% of indium composition.

28. The light emitting device according to claim 1, wherein the active layer has 22% to 40% of indium composition.

29. The light emitting device according to claim 1, wherein the first-type is n-type and the second-type is p-type.

30. The light emitting device according to claim 1, wherein the first-type GaN-based layer is doped with Si.

31. The light emitting device according to claim 30, wherein the doping concentration of Si is about $10^{17}$ cm$^{-3}$ or greater.

32. The light emitting device according to claim 1, wherein the second-type GaN-based layer is doped with Mg.

33. The light emitting device according to claim 32, wherein the doping concentration of Mg is about $10^{17}$ cm$^{-3}$ or greater.

34. The light emitting device according to claim 1, wherein the second electrode is located at or near an edge of the second surface.

35. The light emitting device according to claim 1, wherein the reflective conductive layer has a third surface facing the first surface, and wherein the area of the first surface is substantially the same as the area of the third surface.

36. The light emitting device according to claim 1, wherein a width of the reflective conductive layer is substantially the same as a width of the metal layer.

37. The light emitting device according to claim 1, wherein a width of the active layer is substantially the same as a width of the first-type GaN-based layer.

38. The light emitting device according to claim 37, wherein the width of the active layer is configured to enhance brightness of the device.

39. The light emitting device according to claim 1, wherein a width of the active layer is substantially the same as a lateral width of the device.

40. The light emitting device according to claim 1, wherein the reflective conductive layer and the second electrode are substantially vertically arranged with respect to the active layer so as to reduce an effect from static electricity therebetween.

41. The light emitting device according to claim 1, wherein the reflective conductive layer and the second electrode are substantially vertically arranged with respect to the active layer so as to be suitable for a high voltage device.

42. The light emitting device according to claim 1, wherein the reflective conductive layer and the second electrode are substantially vertically arranged with respect to the active layer so as to enhance brightness of the device.

* * * * *